United States Patent
Eun et al.

(10) Patent No.: US 8,129,244 B2
(45) Date of Patent: Mar. 6, 2012

(54) METHOD FOR FABRICATING SEMICONDUCTOR DEVICE

(75) Inventors: Yong-Seok Eun, Gyeonggi-do (KR); Eun-Shil Park, Gyeonggi-do (KR); Tae-Yoon Kim, Gyeonggi-do (KR); Min-Soo Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/830,066

(22) Filed: Jul. 2, 2010

(65) Prior Publication Data

US 2011/0129974 A1    Jun. 2, 2011

(30) Foreign Application Priority Data

Nov. 30, 2009    (KR) .................. 10-2009-0117435

(51) Int. Cl.
*H01L 21/336* (2006.01)

(52) U.S. Cl. ........ 438/268; 438/142; 438/239; 438/241; 438/253; 438/255; 257/E21.657

(58) Field of Classification Search .................. None
See application file for complete search history.

(56) References Cited

U.S. PATENT DOCUMENTS 5,840,591 A * 11/1998 Park et al. .................. 438/262
7,045,842 B2 * 5/2006 Park et al. .................. 257/296

FOREIGN PATENT DOCUMENTS

| KR | 1020040009864 | 1/2004 |
| KR | 1020090068713 | 6/2009 |
| KR | 1020090068761 | 6/2009 |

OTHER PUBLICATIONS

Notice of Allowance issued from Korean Intellectual Property Office on Nov. 30, 2011.

* cited by examiner

*Primary Examiner* — N Drew Richards
*Assistant Examiner* — Kyoung Lee
(74) *Attorney, Agent, or Firm* — IP & T Group LLP

(57) ABSTRACT

A method for fabricating a semiconductor device includes forming a plurality of first trenches by etching a substrate, forming a plurality of buried bit lines in the first trenches, forming a plurality of second trenches to expose at least one sidewall of the buried bit lines by etching the substrate, and forming a plurality of one-sidewall contact plugs which fill the second trenches.

15 Claims, 10 Drawing Sheets

METHOD FOR FABRICATING SEMICONDUCTOR DEVICE

CROSS-REFERENCE TO RELATED APPLICATIONS

The present application claims priority of Korean Patent Application No. 10-2009-0117435, filed on Nov. 30, 2009, which is incorporated herein by reference in its entirety.

BACKGROUND OF THE INVENTION

Exemplary embodiments of the present invention relate to a method for fabricating a semiconductor device, and more particularly, to a method for fabricating a semiconductor device having a buried bit line connected to a one-sidewall contact.

There is a limit to improving an integration degree of a conventional MOSFET element because a leakage current, an on-current, and a short channel effect may result as the element is ultra-miniaturized. To address such a limit, a planar channel has been replaced with a vertical channel protruding in a perpendicular direction from a substrate.

Hereafter, the structure of a conventional vertical-channel semiconductor device and concerns thereof are described in detail with reference to FIGS. 1A and 1B.

Figure 1A:
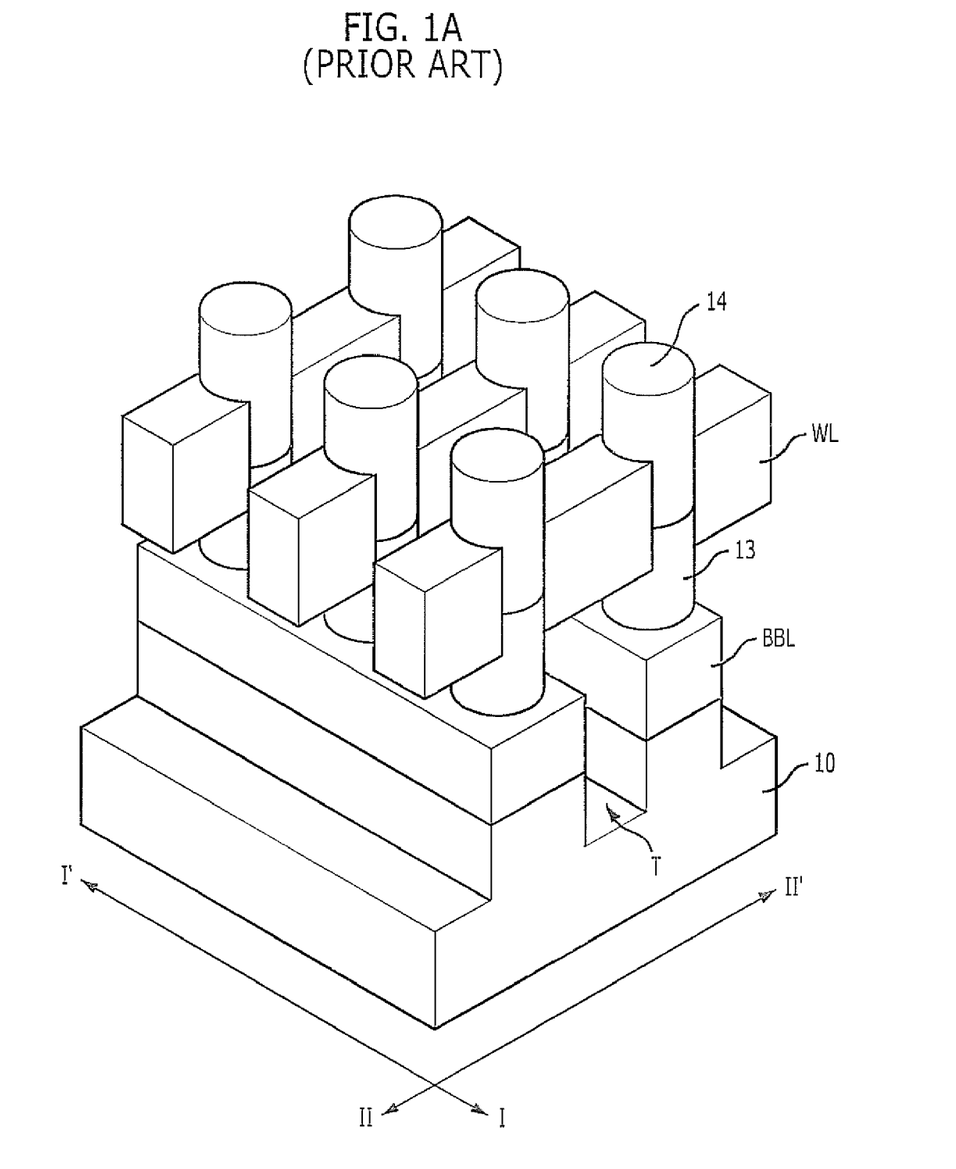
FIGS. 1A and 1B are diagrams illustrating the structure of a conventional vertical-channel semiconductor device.
Figure 1B:
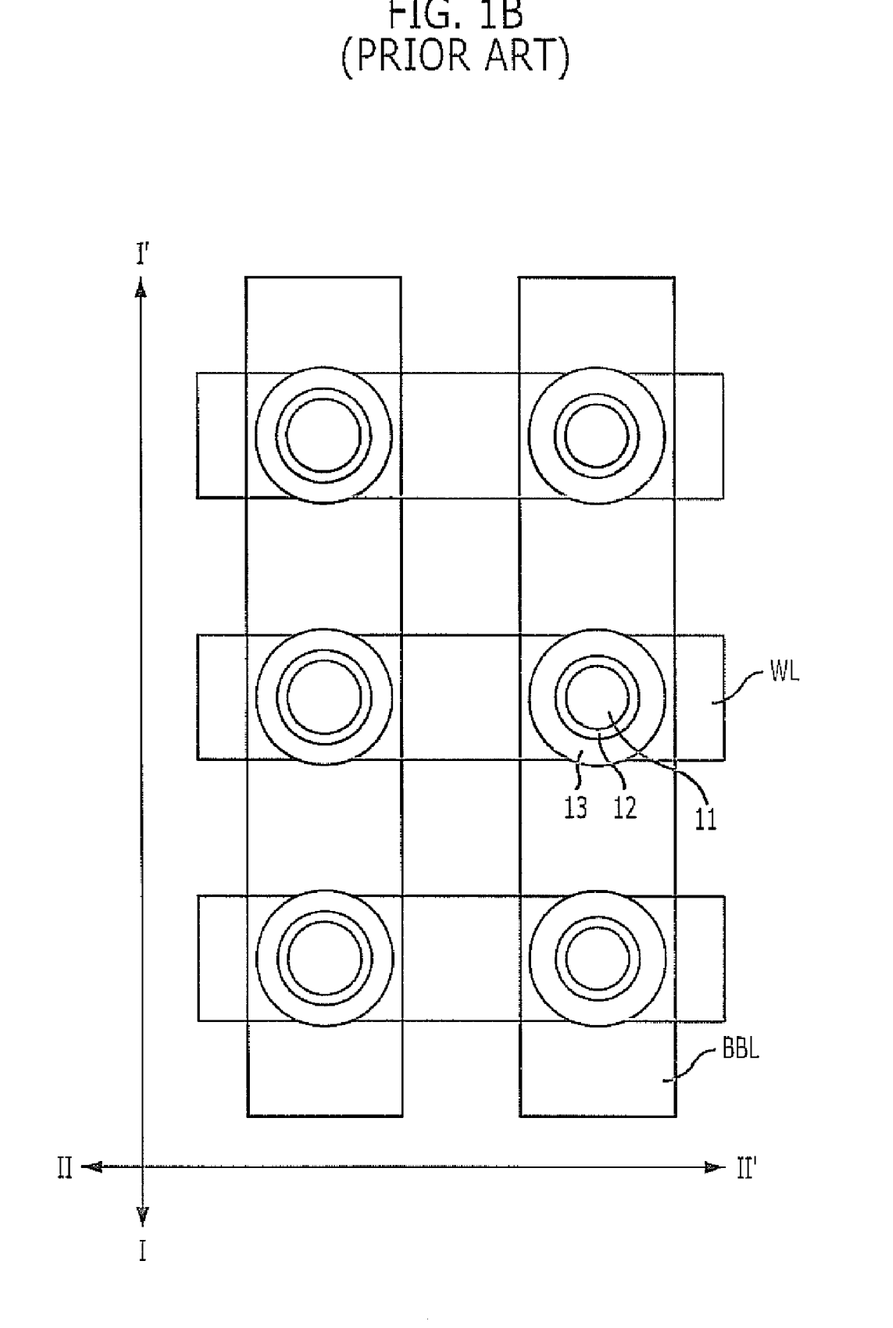

FIGS. 1A and 1B are diagrams illustrating the structure of the conventional vertical-channel semiconductor device. FIG. 1A is a perspective view of the semiconductor device, and FIG. 1B is a plan view of the semiconductor device.

Referring to FIGS. 1A and 1B, the conventional vertical-channel semiconductor device includes a plurality of pillars 11 protruding from a substrate 10, a plurality of parallel buried bit lines BBL extended along a first direction I-I', and a plurality of parallel word lines WL extended along to a second direction II-II' crossing over the first direction I-I'.

Specifically, a plurality of pillar structures, including a first hard mask layer 14 and the pillars 11, extend in a vertical direction from the substrate 10. Each of the pillars 11 is surrounded by a gate electrode 13, and a gate dielectric layer 12 is interposed between the pillar 11 and the gate electrode 13 as shown FIG. 1B.

The buried bit lines BBL are formed by implanting impurity ions into the substrate 10, and a trench T is formed between the neighboring buried bit lines BBL. Although not illustrated in FIG. 1A, an insulation layer for separating the neighboring buried bit lines from each other is filled in the trench T.

Each of the word lines WL connects the gate electrodes 13 of the pillars 11 arranged in the second direction II-II', and is extended to cross over the corresponding buried bit line BBL.

In accordance with the conventional vertical-channel semiconductor device, since the buried bit lines BBL are formed by implanting dopants into the substrate 10 through an ion implantation process, there is a limit in reducing the resistance of the buried bit lines BBL.

Furthermore, while the word lines WL are formed after the gate electrodes 13 are formed, the sheet resistance of the word lines WL may be increased by resistance components of the gate electrodes 13.

Furthermore, when the hard mask layer 14 and the substrate 10 are etched to form the pillar structures, the pillar structures may be inclined or collapse in the fabricating process of the semiconductor device, because the pillar structures have a large aspect ratio.

SUMMARY OF THE INVENTION

Exemplary embodiments of the present invention are directed to a method for fabricating a semiconductor device, which is capable of reducing the resistance of buried bit lines thereof.

Exemplary embodiments of the present invention are also directed to a method for fabricating a semiconductor device, which is capable of preventing pillars from becoming inclined or collapsing.

In accordance with an exemplary embodiment of the present invention, a method for fabricating a semiconductor device includes forming a plurality of first trenches by etching a substrate, forming a plurality of buried bit lines in the first trenches, forming a plurality of second trenches to expose at least one sidewall of the buried bit lines by etching the substrate, and forming a plurality of one-sidewall contact plugs which fill the second trenches.

In accordance with another exemplary embodiment of the present invention, a method for fabricating a semiconductor device includes forming a plurality of first line-type trenches by etching a substrate, forming a plurality of bit lines buried in the first trenches, forming a plurality of second line-type trenches to expose one sidewall of the bit lines by etching the substrate, forming a plurality of one-sidewall contact plugs which fill the second trenches, forming an inter-layer dielectric layer over the entire resultant structure having the one-sidewall contact plugs formed therein, forming a plurality of third trenches by selectively etching the inter-layer dielectric layer to expose a surface of the substrate in a region distinct from regions where the buried bit lines and the one-sidewall contact plugs are formed, and forming a plurality of pillars buried in the third trenches.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

FIGS. 2A to 2G are perspective views explaining a method for fabricating a vertical-channel semiconductor device in accordance with an exemplary embodiment of the present invention.

Figure 2A:
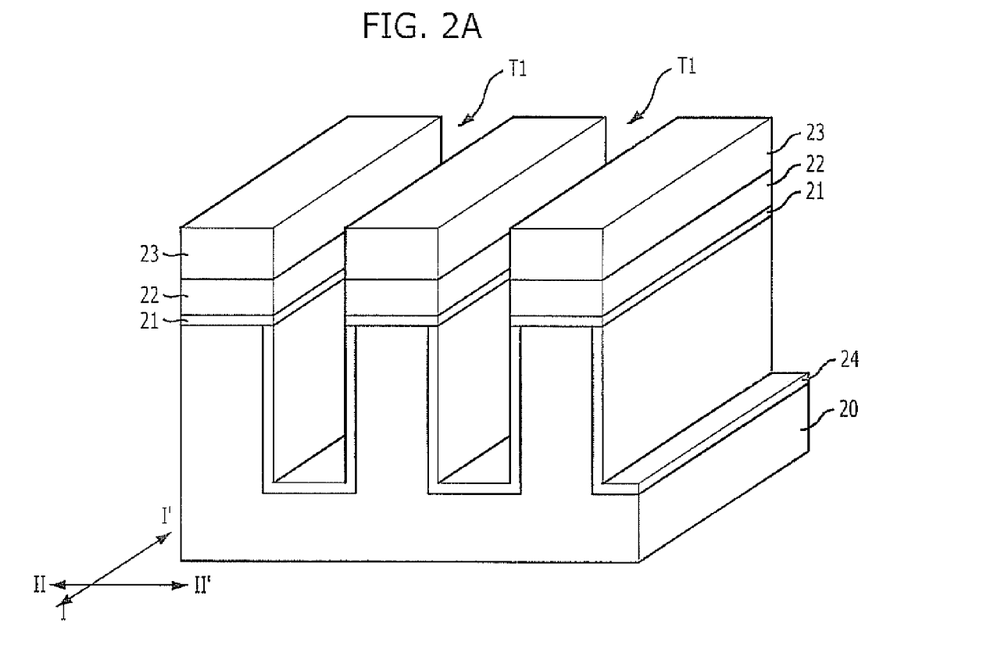
FIGS. 2A to 2G are perspective views explaining a method for fabricating a vertical-channel semiconductor device in accordance with an exemplary embodiment of the present invention.

Referring to FIG. 2A, a pad layer 21 and a first hard mask layer 22 are formed on a substrate 20. The pad layer 21 may include an oxide layer, and the first hard mask layer 22 may include a nitride layer. Furthermore, the pad layer 21 may have a thickness ranging from approximately 50 Å to approximately 100 Å, and the first hard mask layer 22 may have a thickness ranging from approximately 50 Å to approximately 300 Å.

A plurality of mask patterns 23 for buried bit lines are formed on the first hard mask layer 22. The mask patterns 23 may be photoresist patterns. Furthermore, the mask patterns 23 may be line-type patterns extended in parallel along a first direction I-I'.

Using the mask patterns 23 as an etching barrier, the first hard mask layer 22 and the pad layer 21 are etched, and the substrate 20 is then etched to a certain depth to form a plurality of trenches T1 for the buried bit lines. The etching depth of the trenches T1, that is, the etching depth of the substrate 20 may range from approximately 500 Å to approximately 1,000 Å.

A wall oxidation process is performed to form a sidewall oxide layer 24 on inner walls and bottom surfaces of the exposed trenches T1. The sidewall oxide layer 24 may have a thickness ranging from approximately 30 Å to approximately 70 Å.

Figure 2B:
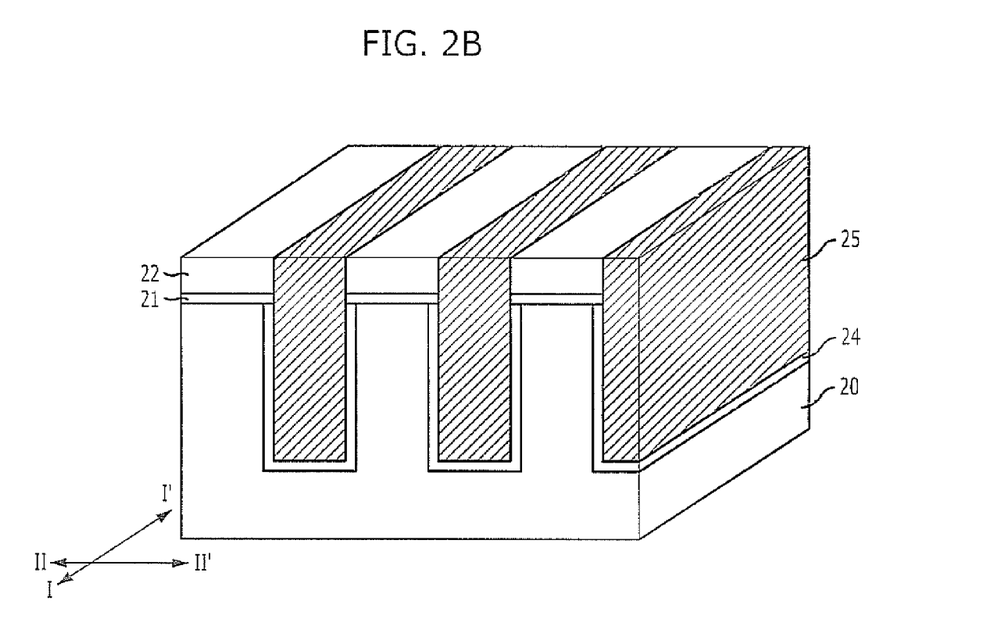

Referring to FIG. 2B, the mask patterns 23 are removed, and a conductive layer is formed on the entire resultant structure having the sidewall oxide layer 24 formed therein. The conductive layer may be deposited to a thickness ranging from approximately 1,000 Å to approximately 1,400 Å. A planarization process is performed until the surface of the first hard mask layer 22 is exposed.

Accordingly, a plurality of buried bit lines 25 are formed in the trenches T1. The buried bit lines 25 may include a tungsten silicide layer. When the buried bit lines 25 are formed of a tungsten silicide $WSi_x$, the buried bit lines 25 are prevented from being oxidized even during a subsequent high-temperature annealing process and a subsequent oxidization process, because the tungsten silicide has a high thermal stability.

Because of the manner in which the buried bit lines 25, including a metallic material, are formed, the resistance of the buried bit lines 25 can be reduced.

Figure 2C:
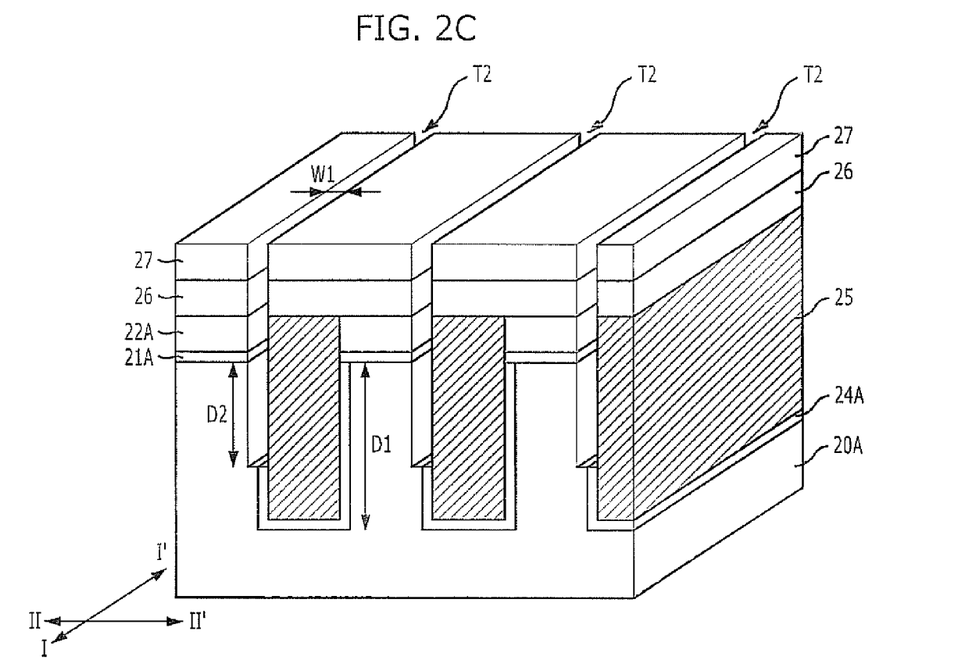

Referring to FIG. 2C, a second hard mask layer 26 is formed on the resultant structure where the buried bit lines 25 are formed. The second hard mask layer 26 may include a nitride layer and have a thickness ranging from approximately 50 Å to approximately 200 Å.

A plurality of line-type mask patterns 27 for subsequently forming one-sidewall contact plugs are formed on the second hard mask layer 26 so as to be extended in parallel along the first direction. Herein, line-type patterns are characterized as parallel structures in the same plane and separated by a space for exposing a surface beneath the plane. The mask patterns 27 may be photoresist patterns.

The mask patterns 27 are used for forming a plurality of one-sidewall contact plugs which may electrically connect one sidewall of pillars, formed by a subsequent process, to the buried bit lines 25. Each of the mask patterns 27 may be formed in such a shape as to expose portions of the second hard mask layer 26 along a line (e.g., a line in the I-I' direction in FIG. 2C) aligned with one sidewall of the buried bit line 25, while covering the corresponding buried bit line 25.

Furthermore, each of the mask patterns 27 may be formed in such a manner that the space between the mask patterns 27 may have a certain width, which extends over the buried bit line 25 by a certain width and over the subsequently formed insulation layer by a certain width. In this case, the one-sidewall contact plug and the buried bit line 25 may overlap each other by a certain width.

Using the mask patterns 27 as an etching barrier, the second hard mask layer 26, the first hard mask layer 22, and the pad layer 21 are etched, and the substrate 20 and the sidewall oxide layer 24 are etched. At this time, the buried bit lines 25 may be partially etched together during the etching of the substrate 20 and the sidewall oxide layer 24. Accordingly, a plurality of trenches T2 for one-side contact plugs are formed to expose one sidewall of the buried bit lines 25.

In FIG. 2C, the substrate having the trenches T2 formed therein is represented by reference numeral 20A, and the first hard mask layer 22, the pad layer 21, and the sidewall oxide layer 24 etched during the forming of the trenches T2 are represented by reference numerals 22A, 21A, and 24A, respectively.

The width W1 of the trenches T2 for the one-sidewall contact plugs may range from approximately 5% to approximately 15% of the depth D1 of the trenches T1 for the buried bit lines 25. The depth D2 of the trenches T2 may range from approximately 70% to approximately 90% of the depth D1 of the trenches T1. For example, when the depth of the trenches T1 ranges from approximately 500 Å to approximately 1,000 Å, the width of the trenches T2 may range from approximately 25 Å to approximately 150 Å.

Figure 2D:
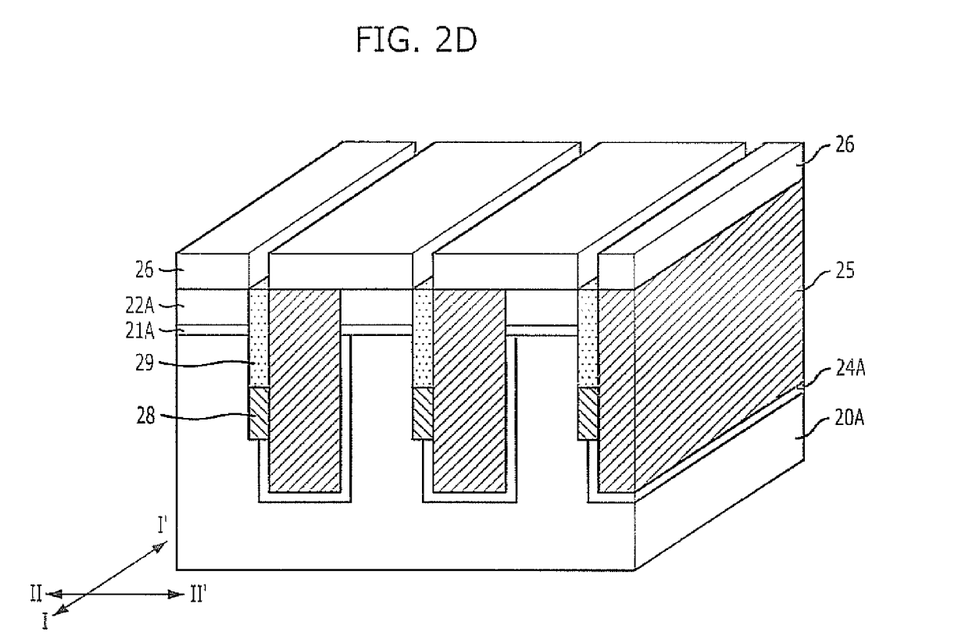

Referring to FIG. 2D, the mask patterns 27 are removed, and a conductive layer for one-sidewall contact plugs 28 is formed on the entire resultant structure wherein the trenches T2 are formed. The one-sidewall contact plugs 28 may include a doped polysilicon layer or a metallic layer. In particular, the one-sidewall contacts 28 may be formed of a metal material having a high thermal stability. Furthermore, the one-sidewall contacts 28 may be formed of a is material having a high etching selectivity with respect to the buried bit lines 25.

An etch back process is performed in such a manner that the conductive layer remains with a certain thickness in the trenches T2. In this case, a blanket etch back process may be performed. Accordingly, the one-sidewall contact plugs 28 are formed so as to partially fill the trenches T2. As such, when the one-sidewall contact plugs 28 are formed after the buried bit lines 25 are formed, damage to the one-sidewall contact plugs 28 caused during the fabricating process of the semiconductor device may be reduced/minimized.

The etch back process may be performed until the conductive layer within the trenches T2 has a remaining volume ranging from approximately 20% to approximately 60% of that of the trenches T2. For example, when the trenches T2 have a width ranging from approximately 50 Å to approximately 100 Å, the etch back process may be performed until the conductive layer with a thickness ranging from approximately 200 Å to approximately 400 Å remains.

Furthermore, the etch back process may be performed under such a condition that the etching selectivity of the conductive layers for the one-sidewall contact plugs with respect to the buried bit lines is high.

An insulation layer 29 is formed on the one-sidewall contact plugs 28 within the trenches T2. The insulation layer 29 is provided to insulate the buried bit lines 25 from the substrate 20A which is to become a drain region, and may be formed by the wall oxidation process. For example, when the buried bit lines 25 including the tungsten silicide are formed, the insulation layer 29 including a silicon oxide SiO₂ may be formed by the wall oxidation process.

The insulation layer 29 may have a thickness ranging from approximately 50 Å to approximately 100 Å.

Figure 2E:
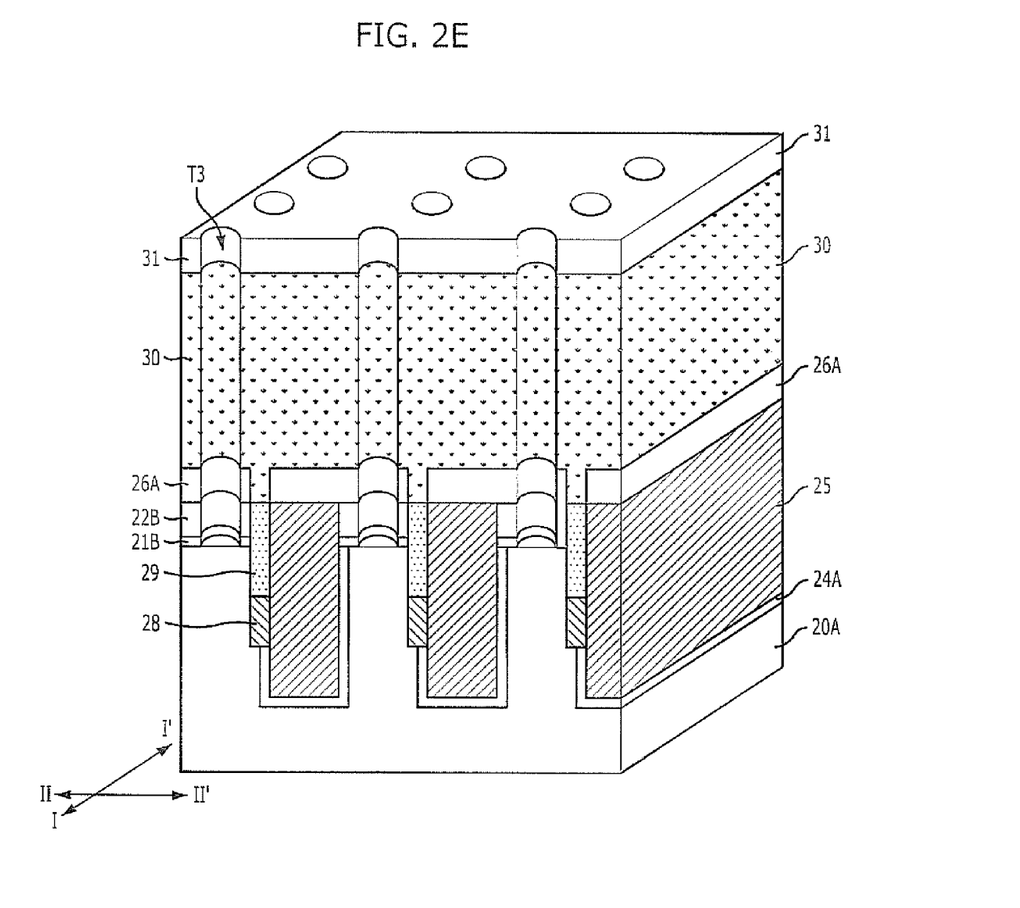

Referring to FIG. 2E, an inter-layer dielectric layer 30 is formed on the entire resultant structure wherein the insulation layer 29 is formed. The inter-layer dielectric layer 30 may include a tetraethyl orthosilicate (TEOS) layer, a high density plasma (HDP) oxide layer, or a spin-on dielectric (SOD) layer which is formed by a chemical vapor deposition (CVD) process, and may have a thickness ranging from approximately 1,000 Å to approximately 2,000 Å.

A mask pattern 31 for subsequently forming pillars is formed on the inter-layer dielectric layer 30.

The mask pattern 31 may be a photoresist pattern. Furthermore, the mask pattern 31 may be formed to have a plurality of openings arranged in the first and second directions I-I' and while covering the regions where the buried bit lines 25 and the one-sidewall contact plugs 28 are formed.

Using the mask pattern 31 as an etching barrier, the inter-layer dielectric layer 30, the second hard mask layer 26, the first hard mask layer 22A, and the pad layer 21A are etched to form a plurality of trenches T3 which expose the surface of the substrate 20A.

At this time, the trenches T3 for subsequently forming pillars are desired to be arranged in such a manner that the buried bit lines 25 and the one-sidewall contact plugs 28 are not exposed.

In FIG. 2E, the second hard mask layer 26, the first hard mask layer 22A, the pad layer 21A etched during the forming of the trenches T3 are represented by reference numerals 26A, 22B, and 21B, respectively.

Figure 2F:
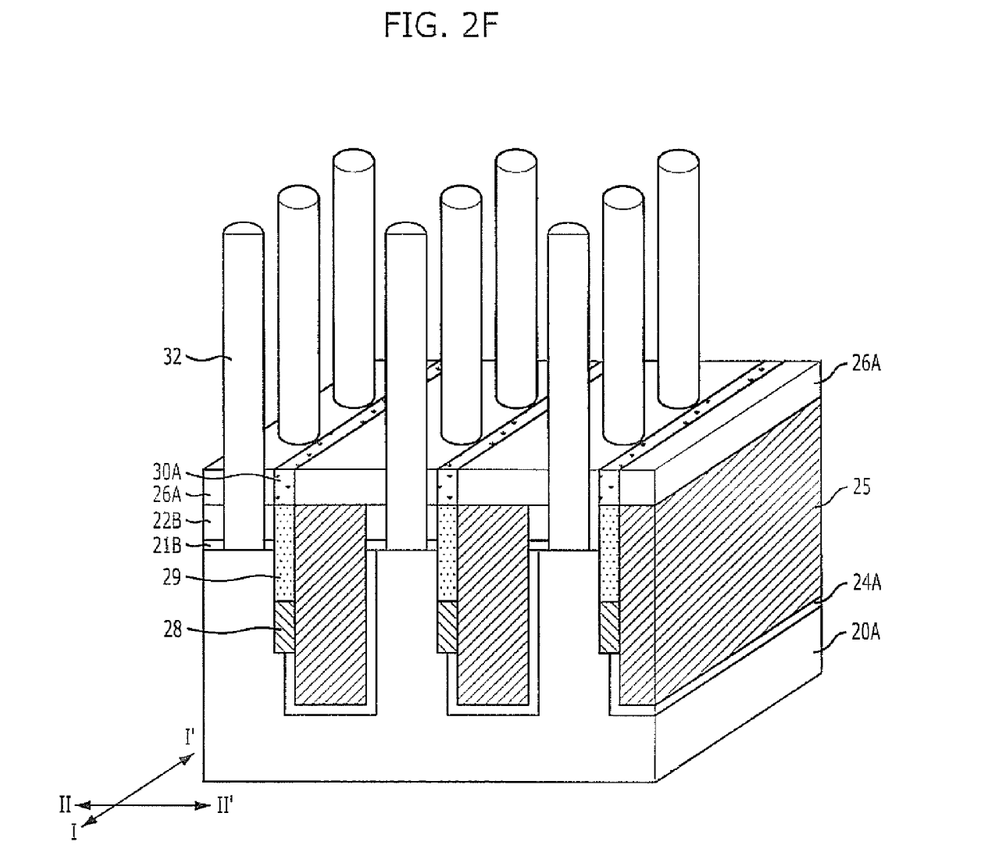

Referring to FIG. 2F, the mask pattern 31 is removed, and a plurality of pillars 32 are formed in the trenches T3. At this time, the pillars 32 may be formed by a silicon epitaxial growth (SEG) process.

When the pillars 32 are formed by the SEG process, a native oxide layer on the surface of the substrate 20A exposed at the bottom of the trenches T3 is removed. The native oxide layer is omitted in FIG. 2F. The removal of the native oxide layer may be performed by a baking process using H₂ gas and a HF vapor process. For example, after the baking process using H₂ gas is performed at a temperature ranging from approximately 700° C. to approximately 1,200° C. for 10 seconds or more, the HF vapor process may be performed for 25 seconds or less.

In the SEG process, a mixed gas of SiH₂Cl₂ (dichloro silane) gas, HCl gas, and H₂ gas or a mixed gas of Si₂H₆ gas and Cl₂ gas may be used as source gas. The SEG process may be performed at a temperature ranging from approximately 700° C. to 1,200° C. Furthermore, a base pressure may be a low pressure ranging from $10^{-6}$ Torr to $10^{-8}$ Torr, and a process pressure may be $10^{-5}$ Torr or less.

A planarization process is performed on the resultant structure where the silicon is deposited by the SEG process until the surface of the inter-layer dielectric layer 30 is exposed. Accordingly, the plurality of pillars 32 arranged in the first and second directions I-I'and II-II' may be formed.

Because the pillars 32 are formed after the buried bit lines 25 and the one-sidewall contact plugs 28 are formed, the pillars 32 may be not become inclined or collapse during the fabricating process of the semiconductor device.

The inter-layer dielectric layer 30 buried between the plurality of pillars 32 is removed to expose the pillars 32. For example, a dry etching process may be performed in such a manner that the inter-layer dielectric layer 30 with a thickness ranging from approximately 30 Å to approximately 70 Å remains on the second hard mask layer 26A, and a wet etching dip process may be performed to remove the inter-layer dielectric layer 30 remaining on the second hard disk layer 26A. In this case, while the inter-layer dielectric layer 30 buried between the plurality of pillars 32 is removed, the inter-layer dielectric layer 30A buried in the trenches T2 within the second hard mask layer 26A may remain. Thus, the remaining portions of the second hard mask layer 26A can prevent the buried bit lines 25 from being exposed as a result of the removal of the inter-layer dielectric layer 30.

Figure 2G:
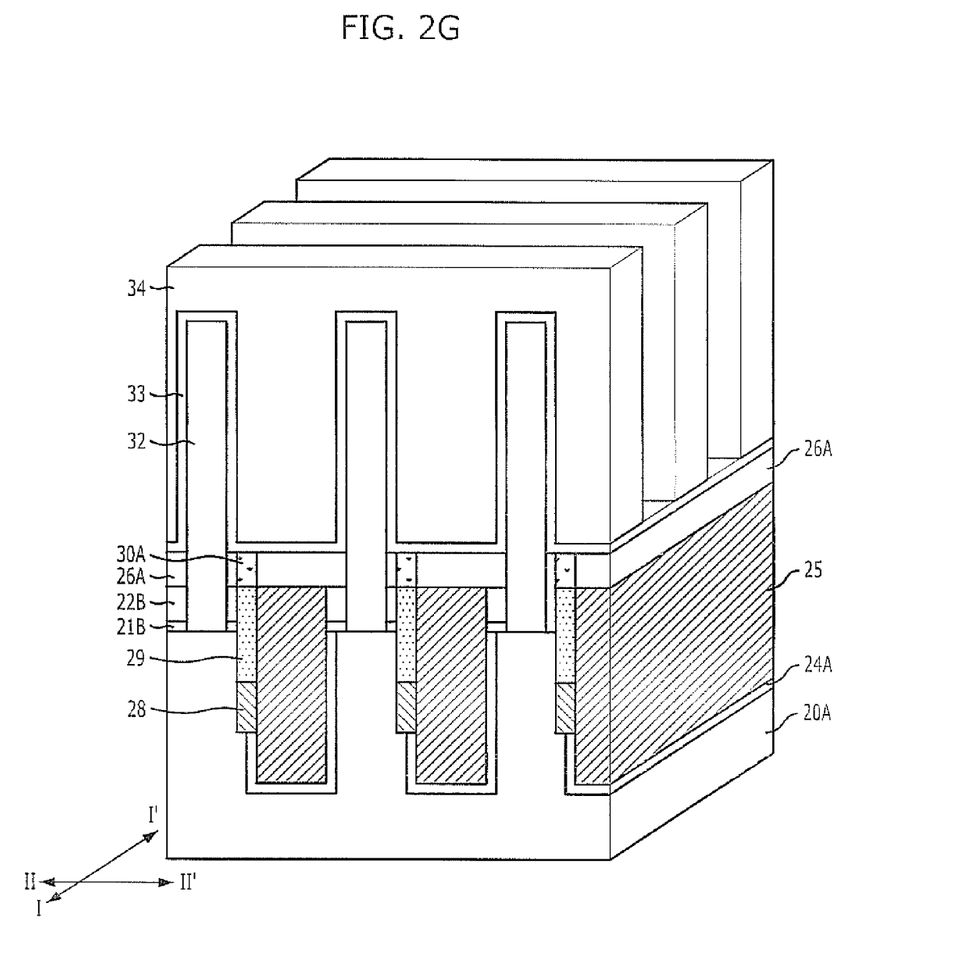

Referring to FIG. 2G, a gate dielectric layer 33 is formed on the entire surface of the resultant structure having the exposed pillars 32. The formation of the gate dielectric layer 33 may be performed by a radical oxidation process. When the radical oxidation process is performed, the surface of the etched second hard mask layer 26A is oxidized. Therefore, the gate dielectric layer 33 is formed on the entire surface of the resultant structure.

A conductive layer is formed on the entire resultant structure wherein the gate dielectric layer 33 is formed. A planarization process is performed, and the conductive layer is etched by using a plurality of word-line mask patterns as an etching barrier. The word-line mask patterns are omitted in FIG. 2G. However, FIG. 2G shows a plurality of word lines 34 formed by the etch using the word-line mask patterns. More specifically, the word lines 34 may be parallel to each other and may extend in the second direction II-II'.

Although not illustrated in FIG. 2G, an inter-layer dielectric layer may be buried in a gap region between the adjacent word lines 34, and processes for forming storage node contact plugs, capacitors, and metal interconnections may be sequentially performed.

Figure 3A:
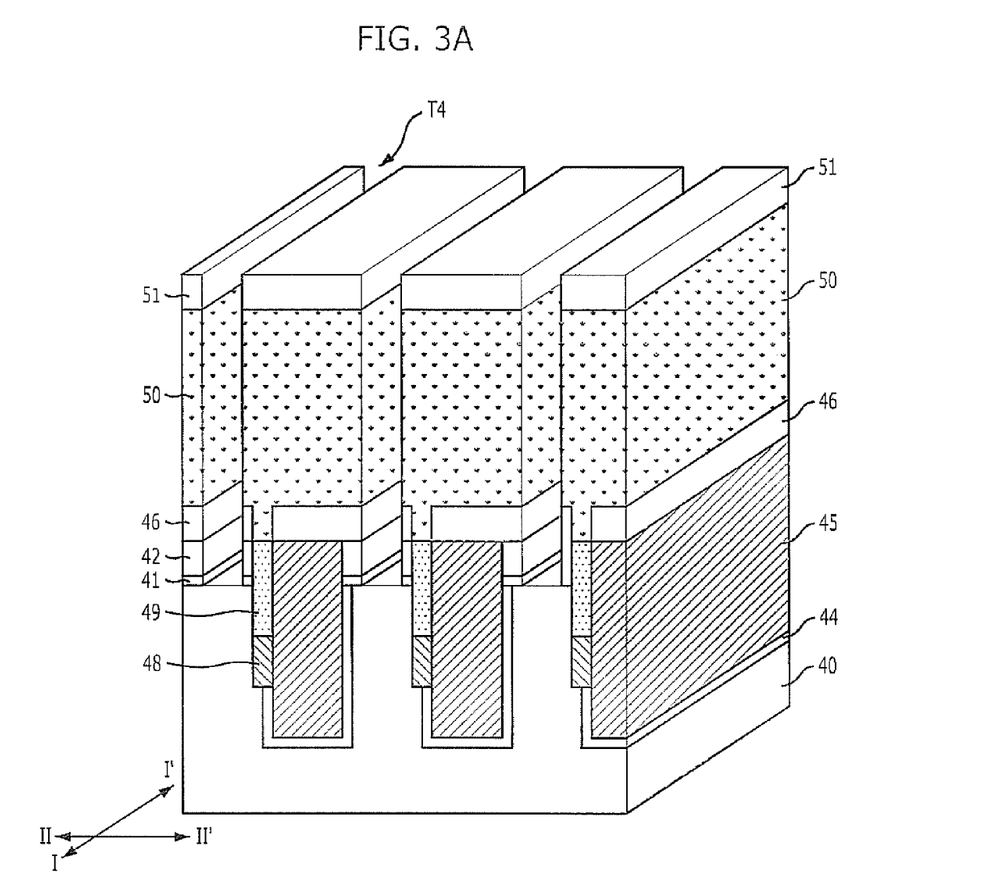
FIGS. 3A to 3C are perspective views explaining a method for fabricating a semiconductor device in accordance with another exemplary embodiment of the present invention.
Figure 3B:
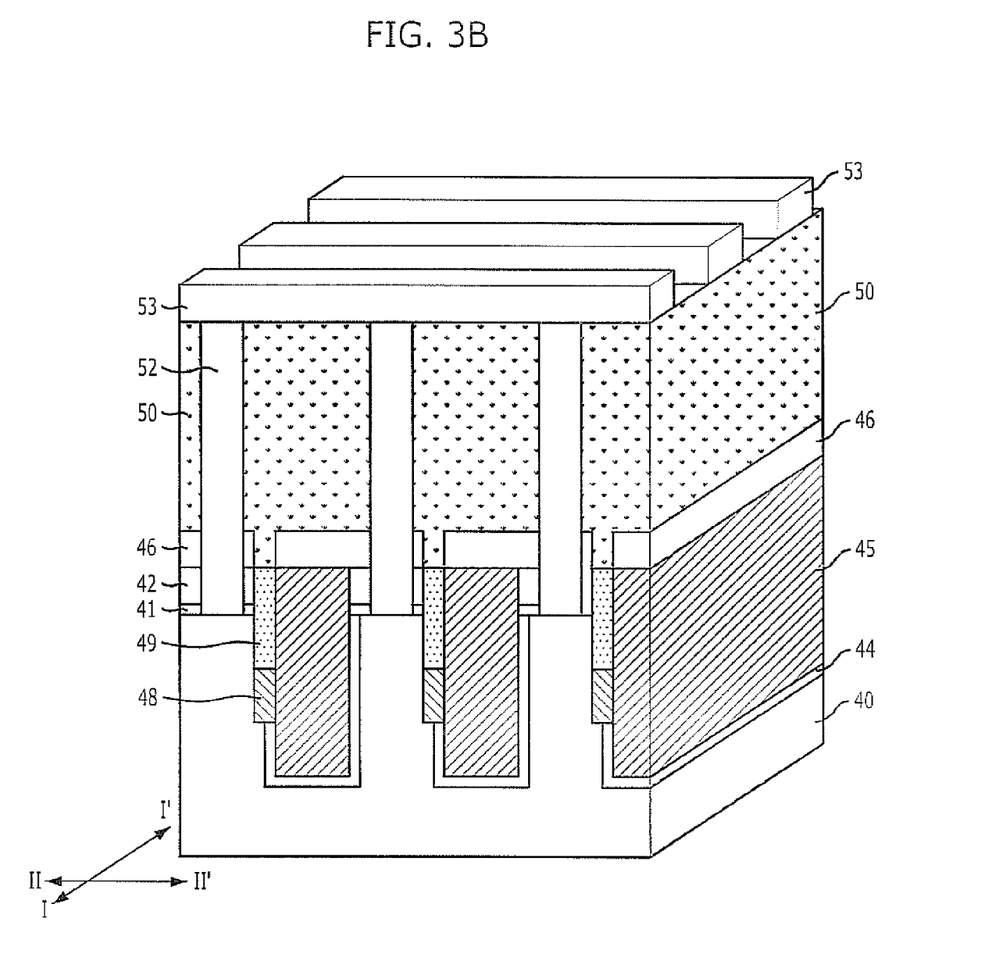
Figure 3C:
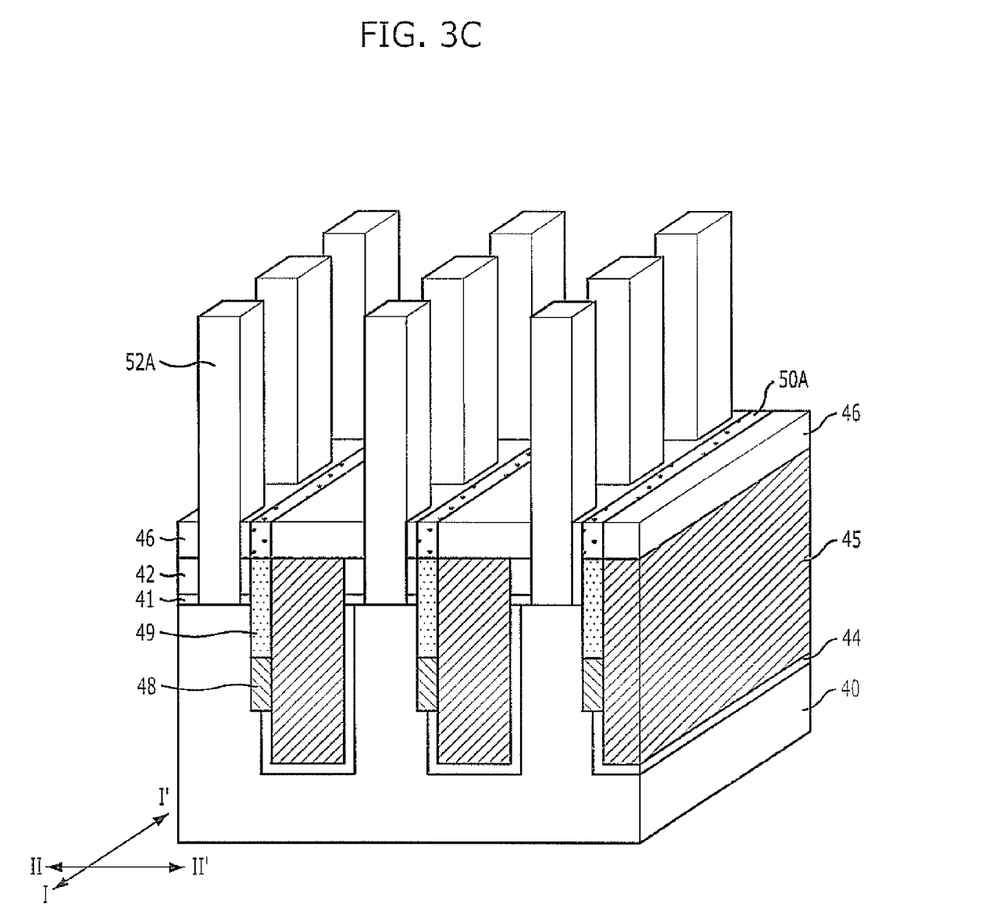

FIGS. 3A to 3C are perspective views explaining a method for fabricating a semiconductor device in accordance with another exemplary embodiment of the present invention. In the following exemplary embodiment of the present invention, the descriptions are focused on the pillar formation process, and other processes overlapping the processes in accordance with the above-discussed exemplary embodiment of the present invention are omitted.

Referring to FIG. 3A, a resultant structure wherein buried bit lines 45 and one-sidewall contact plugs 48 are formed is provided. Processes for forming the buried bit lines 45 and the one-sidewall contact plugs 48 may be performed in the same manner as those in the above-discussed exemplary embodiment of the present invention. Reference numerals 40, 41, 42, 44, 46, and 49 represent a substrate, a pad layer, a first hard mask layer, a sidewall oxidation layer, a second hard mask layer, and an insulation layer, respectively.

An inter-layer dielectric layer 50 is formed on the entire resultant structure having the buried bit lines 45 and the one-sidewall contacts 48, and a plurality of first mask patterns 51 are formed.

The plurality of first mask patterns 51 may be line-type patterns, which extend in the first direction and are parallel to each other, while covering the regions where the buried bit lines 45 and the one-sidewall contact plugs 48 are formed.

Using the first mask patterns 51 as an etching barrier, the inter-layer dielectric layer 50, the second hard mask layer 46, the first hard mask layer 42, and the pad layer 41 are etched to form a plurality of line-type trenches T4 exposing the surface of the substrate 40. At this time, the line-type trenches T4 are to be arranged in such a manner that the buried bit lines 45 or the one-sidewall contact plugs 48 are not exposed during the etching process for forming the line-type trenches T4.

Referring to FIG. 3B, the first mask patterns 51 are removed, and a plurality of active regions 52 are formed in the line-type trenches T4 by the SEG process. For example, as shown in FIG. 3B, The plurality of active regions 52 may extend in the first direction I-I' and may be parallel to each other.

A plurality of line-type second mask patterns 53 are formed on the resultant structure wherein the active regions 52 are formed. The plurality of second mask patterns 53 may, for example, extend in the second direction II-II' and may be parallel to each other, while covering pillar formation regions. The pillar formation regions are island-type regions where pillars are to be formed by a subsequent process and which are arranged at certain intervals in the first and second directions I-I' and II-II'.

Referring to FIG. 3C, the active regions 52 and the inter-layer dielectric layer 50 are etched using the second mask patterns 53 as an etching barrier, and the inter-layer dielectric layer 50 under the second mask patterns 53 is further removed through the above-discussed dry etching and wet etching dip processes in order to form a plurality of pillars 52A arranged in the first and second directions and II-II'.

The etching process of the active regions 52 and the inter-layer dielectric layer 50 using the second mask patterns 53 may be performed under such a condition that the etching selectivity of the active regions 52 with respect to the inter-layer dielectric layer 50 is low. In particular, the etching process may be performed under a non-selectivity condition.

In FIG. 3C, the inter-layer dielectric layer, which remains in the trenches within the second hard mask layer 46A after the etching process of the active regions 52, is represented by a reference numeral 50A.

Although not illustrated in FIG. 3C, a gate dielectric layer is formed on the entire surface of the resultant structure wherein the pillars 52A are formed, and a word-line conductive layer is formed on the gate dielectric layer. The word-line conductive layer is patterned to form a plurality of word lines, which extend in the second direction II-II' and are parallel to each other.

In accordance with the exemplary embodiments of the present invention, because of the manner in which the buried bit lines, including a metallic material, are formed, the resistance of the buried bit lines can be reduced. Furthermore, since the one-sidewall contact plugs are formed after the buried bit lines are formed, the one-sidewall contacts can be prevented from being damaged during the fabricating process.

Furthermore, since the pillars are formed after the buried bit lines and the one-sidewall contact plugs are formed, the pillars may be prevented from becoming inclined or collapsing while the buried bit lines and the one-sidewall contact plugs are formed.

While the present invention has been described with respect to the specific exemplary embodiments, it will be apparent to those skilled in the art that various changes and modifications may be made without departing from the spirit and scope of the invention as defined in the following claims.

What is claimed is:

1. A method for fabricating a semiconductor device, comprising:
    forming a plurality of first trenches by etching a substrate;
    forming a plurality of buried bit lines in the first trenches;
    forming a plurality of second trenches to expose at least one sidewall of the buried bit lines by etching the substrate; and
    forming a plurality of one-sidewall contact plugs which fill the second trenches,
    wherein the buried bit lines and the one-sidewall contact plugs are line-type patterns, which extend in a first direction.

2. The method of claim 1, wherein the forming of the plurality of one-sidewall contact plugs comprises:
    forming the plurality of second trenches, which extend in the first direction and are parallel to each other, by etching the substrate;
    forming a conductive layer for the one-sidewall contact plugs over the entire resultant structure having the second trenches formed therein;
    forming the one-sidewall contact plugs by performing an etch back process such that the conductive layer remains with a certain thickness within the second trenches; and
    forming an insulation layer over the one-sidewall contact plugs within the second trenches.

3. The method of claim 2, wherein the etch back process is performed in such a manner that the conductive layer remains with a volume ranging from approximately 20% to approximately 60% of a volume of the second trenches.

4. The method of claim 2, wherein the insulation layer is formed by an oxidation process.

5. The method of claim 1, wherein a width of the second trenches ranges from approximately 5% to approximately 15% of a depth of the first trenches, and a depth of the second trenches ranges from approximately 70% to approximately 90% of the depth of the first trenches.

6. The method of claim 1, wherein the buried bit lines comprise a metallic silicide layer.

7. The method of claim 1, wherein the one-sidewall contact plugs comprise a doped polysilicon layer or a metallic layer.

8. The method of claim 1, further comprising:
    forming an inter-layer dielectric layer over the entire resultant structure having the one-sidewall contacts formed therein;
    forming a plurality of third trenches by selectively etching the inter-layer dielectric layer to expose a surface of the substrate in a region distinct from regions where the buried bit lines and the one-sidewall contact plugs are formed; and
    forming a plurality of pillars in the third trenches by using an epitaxial growth process.

9. The method of claim 8, wherein the inter-layer dielectric layer is formed with a thickness ranging from approximately 1,000 Å to approximately 2,000 Å.

10. The method of claim 8, wherein the forming of the plurality of third trenches comprises:
    forming a mask pattern over the resultant structure having the interlayer dielectric layer formed therein, the mask pattern having a plurality of openings arranged in the first direction and a second direction crossing over the first direction while covering the regions where the buried bit lines and the one-sidewall contacts are formed; and
    forming the third trenches by etching the inter-layer dielectric layer using the mask pattern as an etching barrier.

11. The method of claim 8, further comprising:
    removing the inter-layer dielectric layer to expose the pillars;
    forming a gate dielectric layer over the entire surfaces of the pillars; and
    forming a plurality of word lines, which extend in the second direction and are parallel to each other.

12. The method of claim 1, further comprising:
    forming an inter-layer dielectric layer over the entire resultant structure having the one-sidewall contact plugs formed therein;

forming a plurality of first mask patterns over the inter-layer dielectric layer, the first mask patterns extending in the first direction and being parallel to each other, while covering regions where the buried bit lines and the one-sidewall contact plugs are formed;

forming a plurality of line-type trenches, exposing a surface of the substrate, by etching the inter-layer dielectric layer using the first mask patterns as an etching barrier;

forming a plurality of active regions in the line-type trenches by using an epitaxial growth process;

forming a plurality of second mask patterns over the resultant structure having the active regions formed therein, the second mask patterns extend in a second direction and are parallel to each other, and cross over the first direction while covering pillar formation regions; and forming a plurality of pillars arranged in the first and second directions by etching the active regions and the inter-layer dielectric layer using the second mask patterns as an etching barrier.

13. The method of claim 12, wherein, in the forming of the plurality of pillars, an etching process is performed in such a condition that an etching selectivity of the active regions with respect to the inter-layer dielectric layer is low.

14. A method for fabricating a semiconductor device, comprising:

forming a plurality of first line-type trenches by etching a substrate;

forming a plurality of bit lines buried in the first trenches;

forming a plurality of second line-type trenches to expose one sidewall of the bit lines by etching the substrate;

forming a plurality of one-sidewall contact plugs which fill the second trenches;

forming an inter-layer dielectric layer over the entire resultant structure having the one-sidewall contact plugs formed therein;

forming a plurality of third trenches by selectively etching the inter-layer dielectric layer to expose a surface of the substrate in a region distinct from regions where the buried bit lines and the one-sidewall contact plugs are formed; and forming a plurality of pillars buried in the third trenches.

15. The method of claim 14, wherein the forming of the plurality of pillars is performed by an epitaxial growth process.

* * * * *